US012648318B2

(12) United States Patent
Liu et al.

(10) Patent No.: US 12,648,318 B2
(45) Date of Patent: Jun. 2, 2026

(54) ARRAY BASE PLATE, DISPLAY PANEL AND DISPLAY APPARATUS

(71) Applicant: KunShan Go-Visionox Opto-Electronics Co., Ltd, Kunshan (CN)

(72) Inventors: Shaowei Liu, Kunshan (CN); Zhili Ma, Kunshan (CN); Pei Duan, Kunshan (CN); Miaomiao Tian, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 386 days.

(21) Appl. No.: 18/497,044

(22) Filed: Oct. 30, 2023

(65) Prior Publication Data

US 2024/0057421 A1     Feb. 15, 2024

Related U.S. Application Data

(63) Continuation of application No. PCT/CN2022/115281, filed on Aug. 26, 2022.

(30) Foreign Application Priority Data

Dec. 31, 2021     (CN) .......................... 202111674891.5

(51) Int. Cl.
*H10K 59/131*          (2023.01)
*H10W 42/60*          (2026.01)

(52) U.S. Cl.
CPC ........ *H10K 59/1315* (2023.02); *H10W 42/60* (2026.01)

(58) Field of Classification Search
CPC .................................................. H10K 59/1315
See application file for complete search history.

(56) References Cited

U.S. PATENT DOCUMENTS

2006/0077162 A1*   4/2006   Chou ................ G02F 1/136204
                                                                    345/92
2020/0006449 A1     1/2020   Yu et al.
2020/0350309 A1   11/2020   Long

FOREIGN PATENT DOCUMENTS

CN          101568950 A     10/2009
CN          103268876 B       3/2016
                    (Continued)

OTHER PUBLICATIONS

International Search Report issued Oct. 24, 2022, in corresponding International Application No. PCT/CN2022/115281, 4 pages.
                    (Continued)

*Primary Examiner* — William A Harriston
(74) *Attorney, Agent, or Firm* — Maier & Maier, PLLC

(57)          ABSTRACT

An array base plate, a display panel and a display apparatus. The array base plate includes a display area and a non-display area arranged adjacently. The array base plate includes: a substrate; a semiconductor layer located on the substrate and including a plurality of semiconductor portions distributed in an array along a first direction and a second direction; and one or more electrostatic protection portions each including a connection end and a free end opposing to each other, the connection end being connected with at least one of the semiconductor portions, and the free end extending from the connection end to the non-display area. In the present application, the electrostatic protection performance of the array base plate can be effectively improved by arranging the electrostatic protection portions.

18 Claims, 9 Drawing Sheets

(56)           References Cited

FOREIGN PATENT DOCUMENTS

| CN | 111653576 A | 9/2020 |
| CN | 111863878 A | 10/2020 |
| CN | 112670304 A | 4/2021 |
| CN | 113078174 A | 7/2021 |
| CN | 113471265 A | 10/2021 |
| CN | 114361135 A | 4/2022 |
| KR | 2020077948 A | 7/2020 |

OTHER PUBLICATIONS

Office Action issued on Jan. 23, 2025, in corresponding Korean Application No. 10-2023-7037409, 14 pages.
Office Action issued on May 31, 2025, in corresponding Chinese Application No. 202111674891.5, 14 pages.

\* cited by examiner 100    1000

ARRAY BASE PLATE, DISPLAY PANEL AND DISPLAY APPARATUS

CROSS-REFERENCE TO RELATED APPLICATION

The present application is a continuation of International Application No. PCT/CN2022/115281 filed on Aug. 26, 2022, which claims priority to Chinese Patent Application No. 202111674891.5 filed on Dec. 31, 2021, both of which are incorporated herein by reference in their entireties.

TECHNICAL FIELD

The present application relates to the field of display technology, and particularly, to an array base plate, a display panel, and a display apparatus.

BACKGROUND

Organic light emitting diode (OLED) is one of the research hotspots in the field of display. Compared with liquid crystal display (LCD), the OLED display has advantages such as low power consumption, low production cost, self-luminous, wide viewing angle, and fast response. At present, the OLED array base plate is replacing the LCD array base plate in the mobile phone, the personal digital assistant (PDA), the digital camera, and the like.

In order to improve the human visual experience, the resolution of the display panel is getting higher and higher, resulting in smaller pixels and higher integration. The increased integration results in decreased resistance to electrostatic breakdown of the device.

SUMMARY

The present application provides an array base plate, a display panel and a display apparatus, in which the electrostatic protection capability of the array base plate can be improved.

Embodiments of a first aspect of the present application provide an array base plate including a display area and a non-display area arranged adjacently, and the array base plate includes: a substrate; a semiconductor layer located on the substrate and including a plurality of semiconductor portions distributed in an array along a first direction and a second direction; and one or more electrostatic protection portions each comprising a connection end and a free end opposing to each other, the connection end being connected with at least one of the semiconductor portions, and the free end extending from the connection end to the non-display area.

Embodiments of a second aspect of the present application provide a display panel including the array base plate according to any of the embodiments of the first aspect.

Embodiments of a third aspect of the present application provide a display apparatus including the display panel according to any of the embodiments of the second aspect.

The array base plate according to the embodiments of the present application includes the display area and the non-display area arranged adjacently, and when the array base plate is used in the display panel, the display panel can display image in the display area. The array base plate includes the substrate and the semiconductor layer including the plurality of semiconductor portions distributed in an array in the first direction and the second direction; the array base plate further includes the electrostatic protection portions, the connection end of the electrostatic protection portion is connected with at least one of the semiconductor portions, and the free end of the electrostatic protection portion extends to the non-display area. The static electricity generated by the array base plate can be transmitted to the connection end through the semiconductor portions, and then transmitted from the connection end to the free end located in the non-display area, therefore the static electricity can be discharged by the free end in the non-display area, the electrostatic effect of the array base plate is effectively reduced, and the electrostatic protection capability of the array base plate is improved.

BRIEF DESCRIPTION OF THE DRAWINGS

Other features, objects, and advantages of the present application will become more apparent by reading the following detailed description of the non-limiting embodiments with reference to the accompanying drawings, in which the same or similar reference numerals represent the same or similar features, and the accompanying drawings are not drawn to actual scale.

DETAILED DESCRIPTION

Features and exemplary embodiments of various aspects of the present application will be described in detail below. In order to make the purpose, technical solutions and advantages of the present application clearer, the present application is described in further detail below in combination with the accompanying drawings and specific embodiments. It should be understood that the specific embodiments described herein are only used to explain the present application, but not to limit the present application. For those skilled in the art, the present application can be implemented without some of these specific details. The following description of the embodiments is only to provide a better understanding of the present application by illustrating examples of the present application.

Embodiments of the present application provide an array base plate, a display panel and a display apparatus, which will be described below with reference to FIG. 1 to FIG. 12.

Figure 1:
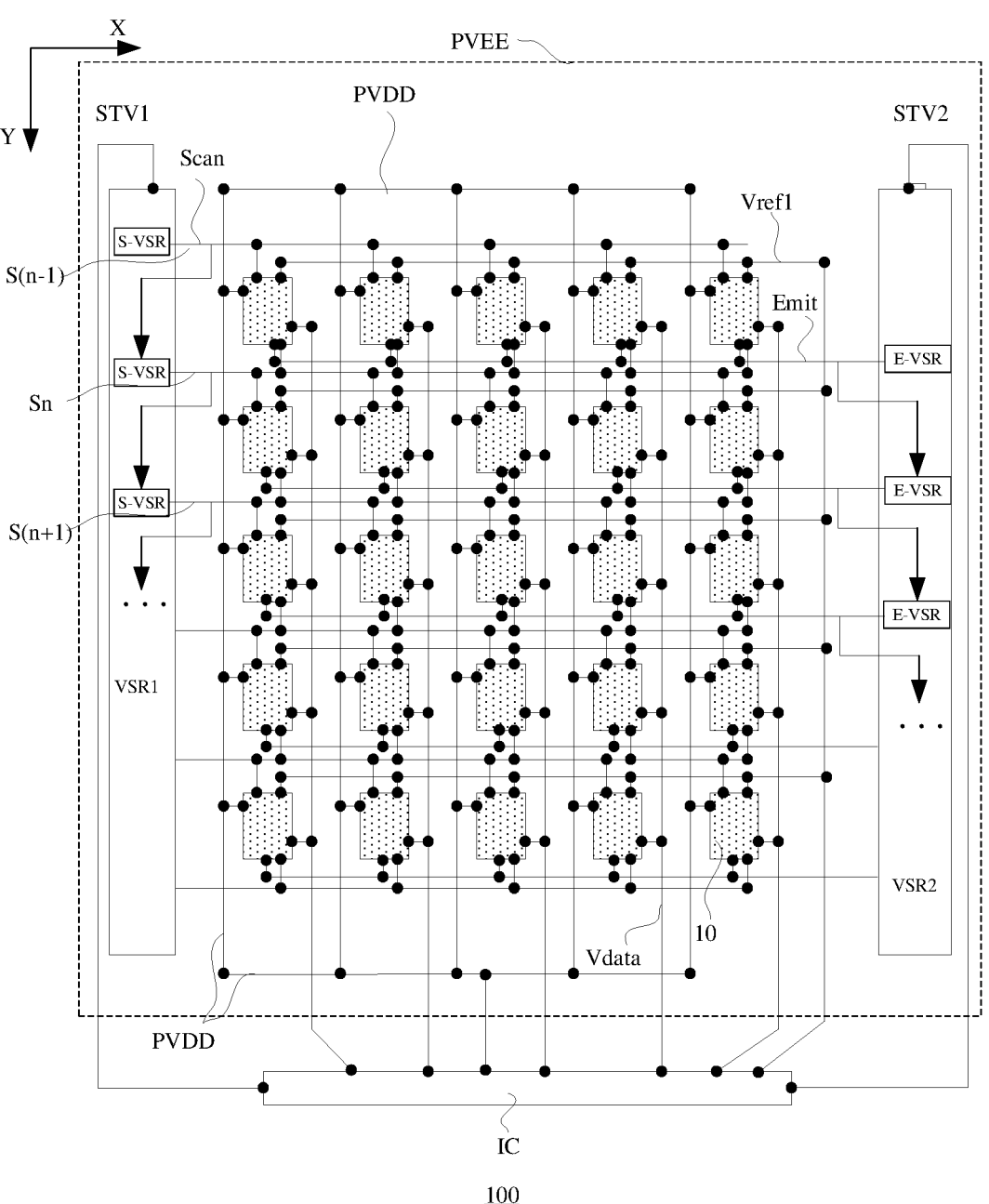
FIG. 1 shows a schematic top view of an array base plate according to the embodiments of the first aspect of the present application.

Referring to FIG. 1, which shows a schematic top view of an array base plate according to the embodiments of the first aspect of the present application.

As shown in FIG. 1, the array base plate 100 according to the embodiments of the present application includes a plurality of pixel circuits 10 which may be distributed in an array. For example, the plurality of pixel circuits 10 may be distributed in an array along a first direction X and a second direction Y intersecting with each other. Exemplarily, the first direction X may be a row direction, and the second direction Y may be a column direction. Alternatively, the first direction X may be the column direction, and the second direction Y may be the row direction.

Exemplarily, the array base plate 100 may further include a driving chip IC, a first gate driving circuit VSR1, a second gate driving circuit VSR2, power supply signal lines PVDD, a common power supply signal end PVEE, data signal lines Vdata, first reference signal lines Vref1, scanning signal lines Scan, and light emission control signal lines Emit.

The first gate driving circuit VSR1 may include a plurality of shift registers S-VSR connected in cascade, each shift register S-VSR is connected with the pixel circuit 10 through the scanning signal line, and the first gate driving circuit VSR1 is configured to provide a scanning signal to the pixel circuit 10. The driving chip IC provides a first start signal STV1 to the first gate driving circuit VSR1. In addition, as shown in FIG. 1, in the plurality of shift registers S-VSR connected in cascade, except for the shift registers S-VSR in the first stage and the last stage, the other shift registers S-VSR may provide scanning signals to two adjacent rows of pixel circuits 10. In this case, two rows of dummy pixel circuits (not shown in FIG. 1) may be arranged on the array base plate and respectively connected with scanning lines of the shift registers S-VSR in the first stage and the last stage, but the dummy pixel circuits are not used for display.

The second gate driving circuit VSR2 may include a plurality of shift registers E-VSR connected in cascade, each shift register E-VSR is connected with the pixel circuit 10 through the light emission control signal line Emit, and the second gate driving circuit VSR2 is configured to provide a light emission control signal to the pixel circuit 10. The driving chip IC provides a second start signal STV2 to the second gate driving circuit VSR2.

In addition, clock signal lines (not shown), high level signal lines (not shown), and low level signal lines (not shown) may be arranged between the first gate driving circuit VSR1 and the driving chip IC and between the second gate driving circuit VSR2 and the driving chip IC, and the driving chip IC provides clock signals, high level signals and low level signals to the first gate driving circuit VSR1 and the second gate driving circuit VSR2.

For example, as shown in FIG. 1, the array base plate 100 may include one first gate driving circuit VSR1 and one second gate driving circuit VSR2, which may be arranged at two opposite sides, or at the same side, of the array base plate 100 along the second direction Y.

As another example, the array base plate 100 may include two first gate driving circuits VSR1 and two second gate driving circuits VSR2, two ends of the scanning signal line are respectively electrically connected with one of the first gate driving circuits VSR1, and two ends of the light emission control signal line Emit are respectively electrically connected with one of the second gate driving circuits VSR2.

As another example, the array base plate 100 includes two first gate driving circuits VSR1, one of the first gate driving circuits VSR1 is electrically connected with the pixel circuits 10 in odd rows through the scanning signal lines, and the other of the first gate driving circuits VSR1 is electrically connected with the pixel circuits 10 in even rows through the scanning signal lines.

As another example, the array base plate 100 includes two second gate driving circuits VSR2, one of the second gate driving circuits VSR2 is electrically connected with the pixel circuits 10 in odd rows through the light emission control signal lines, and the other of the second gate driving circuits VSR2 is electrically connected with the pixel circuits 10 in even rows through the light emission control signal lines.

The above description of the first gate driving circuit VSR1 and the second gate driving circuit VSR2 is only to provide some examples, but not to limit the present application.

Exemplarily, a gate driving circuit capable of generating both the scanning signal and the light emission control signal may be further provided, which is not limited in the present application.

Exemplarily, the pixel circuit 10 includes a storage capacitor Cst and a plurality of transistors including, for example, a power supply writing transistor, a data writing transistor, a driving transistor, a compensation transistor, a gate initialization transistor, a light emission control transistor, and an anode initialization transistor.

A first scanning signal line may be understood as a scanning signal line connected with a control end of the gate initialization transistor in the pixel circuit 10, and a second scanning signal line may be understood as a scanning signal line connected with a control end of the data writing transistor, a control end of the compensation transistor and a control end of the anode initialization transistor in the pixel circuit 10. Generally, each row of the pixel circuits 10 for display are at least correspondingly connected with the first scanning signal line and the second scanning signal line.

Exemplarily, as shown in FIG. 1, in adjacent two rows of pixel circuits 10, the pixel circuits 10 in the upper row are connected with the scanning signal lines S(n−1) and Sn, and the pixel circuits 10 in the lower row are connected with the scanning signal lines Sn and S(n+1). For the pixel circuits 10 in the upper row, the corresponding first scanning signal line is S(n−1), and the corresponding second scanning signal line is Sn; and for the pixel circuits 10 in the lower row, the corresponding first scanning signal line is Sn, and the corresponding second scanning signal line is S(n+1).

The power supply signal line PVDD is configured to provide a power supply voltage to the driving transistor, and a voltage on the power supply signal line PVDD may be a positive voltage. A voltage on the common power supply signal end PVEE may be a negative voltage. The first reference signal line Vref1 is configured to provide a reset voltage signal, and a voltage on the first reference signal line Vref1 may be a negative voltage.

Figure 2:
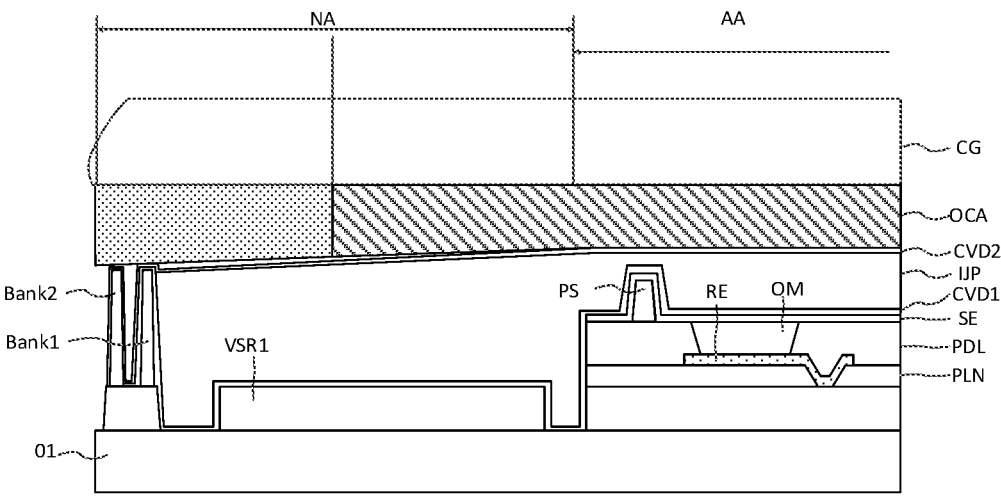
FIG. 2 shows a schematic cross-sectional view of the array base plate according to the embodiments of the first aspect of the present application.
Figure 3:
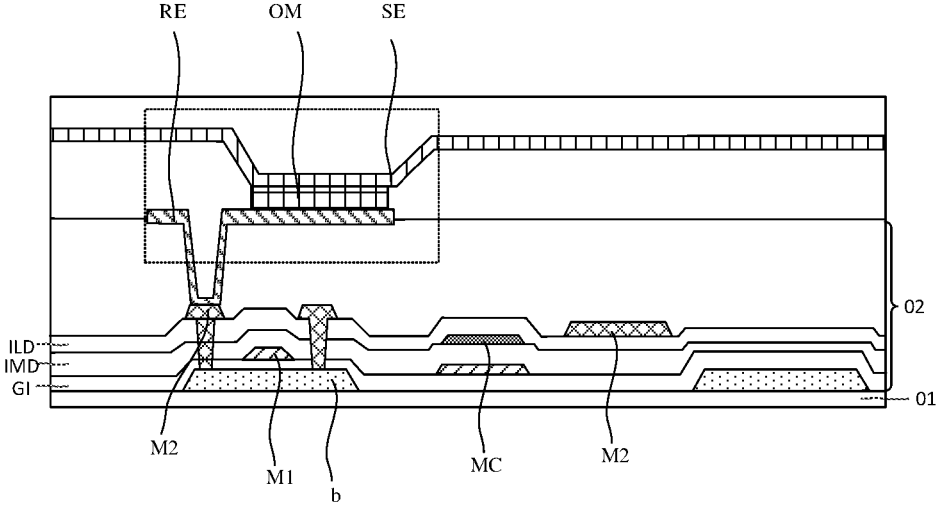
FIG. 3 shows a schematic cross-sectional view of the array base plate according to another embodiment of the first aspect of the present application.

For a better overall understanding of the structure of the array base plate according to the embodiments, reference is made to FIG. 2 and FIG. 3. FIG. 2 shows a schematic cross-sectional view of the array base plate according to the embodiments of the first aspect of the present application; FIG. 3 shows a schematic cross-sectional view of the array base plate according to another embodiment of the first aspect of the present application.

As shown in FIG. 2 and FIG. 3, the array base plate may include a display area AA and a non-display area NA arranged adjacently. Exemplarily, the array base plate includes a substrate 01 and a driving circuit layer 02 arranged at a side of the substrate 01. FIG. 2 further shows a planarization layer PLN, a pixel definition layer PDL, a light-emitting element (including an anode RE, an organic light-emitting layer OM and a cathode SE), a supporting pillar PS, a thin film encapsulation layer (including a first inorganic layer CVD1, an organic layer IJP and a second inorganic layer CVD2), an optical adhesive layer OCA, and a cover plate CG. In addition, FIG. 2 further shows a first gate driving circuit VSR1, a first blocking wall Bank1 and a second blocking wall Bank2. The first gate driving circuit VSR1 may be arranged in the non-display area NA of the driving circuit layer 02.

The pixel circuit 10 may be arranged in the driving circuit layer 02, and is connected with the anode RE of the light-emitting element. As shown in FIG. 3, the driving circuit layer 02 of the array base plate may include a gate metal layer M1, a capacitor metal layer MC and a source-drain metal layer M2 which are stacked along a direction away from the substrate 01. A semiconductor layer b is arranged between the gate metal layer M1 and the substrate 01. Insulating layers are arranged between the various metal layers and between the semiconductor layer b and the gate metal layer M1. Exemplarily, a gate insulating layer GI is arranged between the gate metal layer M1 and the semiconductor layer b, a capacitor insulating layer IMD is arranged between the capacitor metal layer MC and the gate metal layer M1, and an interlayer dielectric layer ILD is arranged between the source-drain metal layer M2 and the capacitor metal layer MC.

The semiconductor layer b is a semiconductor layer where the active layer of the transistor is located, the gate metal layer M1 is a metal conductive layer where the gate of the transistor is located, the capacitor metal layer MC is a metal conductive layer where one of the electrode plates of the capacitor is located, and the source-drain metal layer M2 is a metal conductive layer where the source and the drain of the transistor are located.

Exemplarily, the scanning signal lines S(n−1), Sn, S(n+1), and the light emission control signal line Emit may be arranged in the gate metal layer M1. The first reference signal line Vref1 may be arranged in the capacitor metal layer MC, and the power supply signal line PVDD and the data signal line Vdata may be arranged in the source-drain metal layer M2. The film layers where the signal lines are located may be arranged in other ways, which is not limited in the present application. It can be understood that the above other film layers of the array base plate are also shown in FIG. 2 and FIG. 3 and for reference only.

Applicant found that the transistors of the pixel circuit 10 each include the semiconductor portion located in the semiconductor layer, the semiconductor portions of the plurality of transistors in a same pixel circuit are usually connected with each other. However, the process for manufacturing the semiconductor portions includes a high-temperature process, such as an anneal process and an activation process, and the static electricity in the high-temperature process may have an irreversible effect on the performance of the semiconductor portions, thereby affecting the performance of the corresponding transistor.

Figure 4:
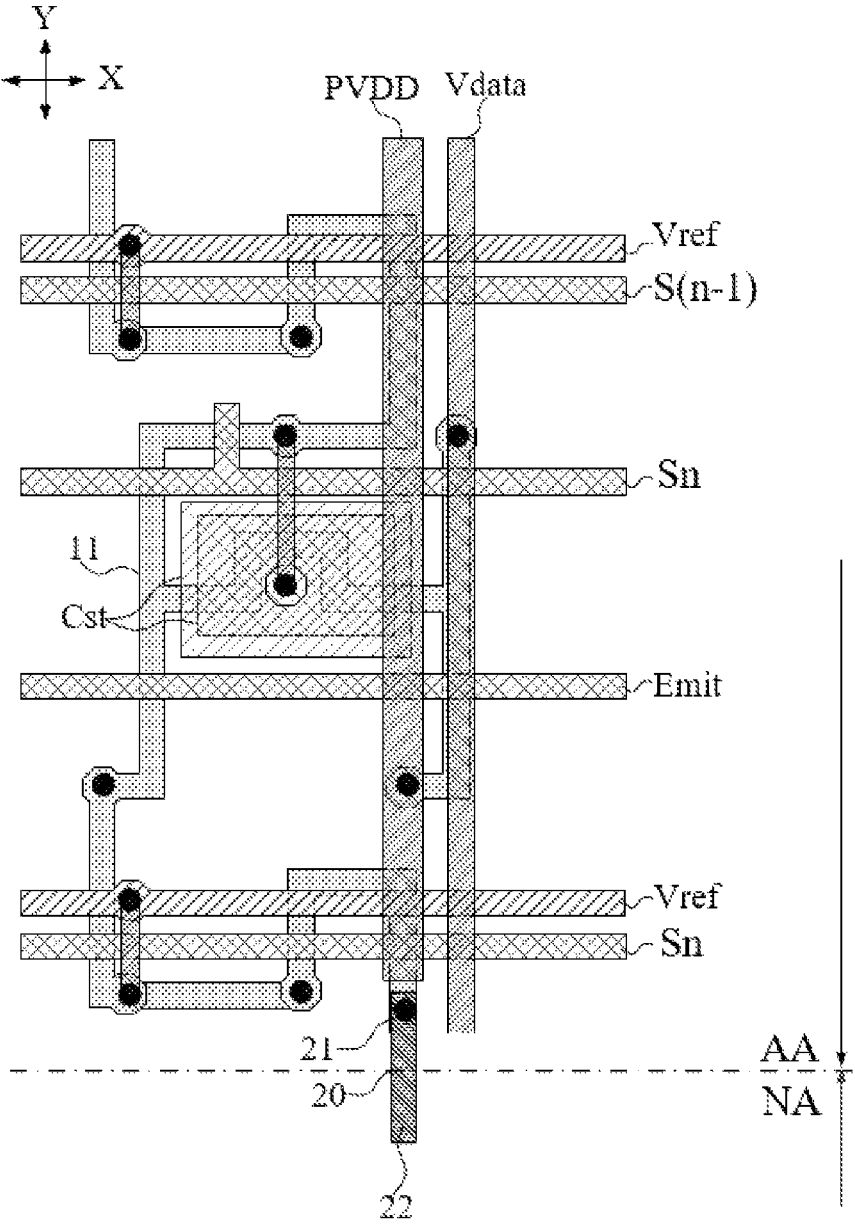
FIG. 4 shows a schematic layout of a pixel circuit of the array base plate according to the embodiments of the first aspect of the present application.

Referring to FIG. 1 to FIG. 4 together, FIG. 4 shows a schematic layout of the pixel circuit 10 of the array base plate 100 according to the embodiments of the first aspect of the present application.

As shown in FIG. 1 to FIG. 4, the embodiments of the first aspect of the present application provide the array base plate 100 including the display area AA and the non-display area NA arranged adjacently, and the array base plate 100 includes the substrate 01, the semiconductor layer b arranged on the substrate 01, and the electrostatic protection portions 20; the semiconductor layer b is arranged on the substrate 01 and includes a plurality of semiconductor portions 11 distributed in an array along the first direction X and the second direction Y; each electrostatic protection portion 20 includes a connection end 21 and a free end 22 opposing to each other, the connection end 21 is connected with at least one of the semiconductor portions 11, and the free end 22 extends from the connection end 21 to the non-display area NA.

The array base plate 100 according to the embodiments of the present application includes the display area AA and the non-display area NA, and when the array base plate 100 is used in the display panel, the display panel can display image in the display area AA. The array base plate 100 includes the electrostatic protection portions 20, the connection end 21 of the electrostatic protection portion 20 is connected with at least one of the semiconductor portions 11, and the free end 22 of the electrostatic protection portion 20 extends to the non-display area NA. The static electricity generated by the array base plate can be transmitted to the connection end 21 through the semiconductor portions 11, and then transmitted from the connection end 21 to the free end 22 located in the non-display area NA, therefore the static electricity can be discharged by the free end 22 in the non-display area NA, the electrostatic effect of the array base plate 100 is effectively reduced, and the electrostatic protection capability of the array base plate 100 is improved.

In addition, in the array base plate 100 according to the embodiments of the present application, the electrostatic protection portion 20 may be used as an antenna connected with the semiconductor portion 11. Through the tip (i.e., the free end 22 of the electrostatic protection portion 20) discharge of the antenna, the static electricity generated during the manufacturing of the array base plate 100 is discharged to the non-display area NA through the antenna (i.e., the electrostatic protection portion 20), so as to eliminate the static electricity accumulation in the whole array base plate 100. Therefore, a potential damage to the array base plate 100 caused by the static electricity can be effectively prevented.

The array base plate 100 further includes a plurality of pixel circuits 10 located in the display area AA and configured to drive the display panel to display. The plurality of pixel circuits 10 are distributed in an array along the first direction X and the second direction Y, and each of the pixel circuits 10 includes at least one semiconductor portion 11.

The electrostatic protection portions 20 may be arranged in various ways. For example, the electrostatic protection portions 20 and the pixel circuits 10 are arranged in one-to-one correspondence, and the semiconductor portion 11 of each pixel circuit 10 is connected with a corresponding electrostatic protection portion 20, so as to improve the electrostatic protection capability of the array base plate 100.

Figure 5:
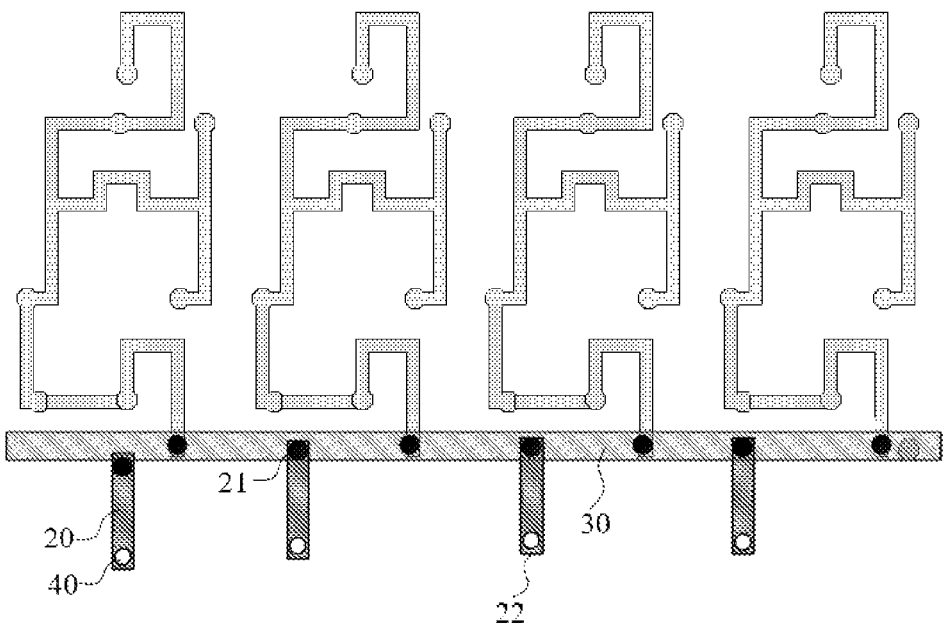
FIG. 5 shows a schematic layout of a semiconductor portion of the array base plate according to the embodiments of the first aspect of the present application.

Referring to FIG. 5, which shows a schematic layout of the semiconductor portion 11 of the array base plate 100 according to the embodiments of the first aspect of the present application.

As shown in FIG. 5, in some other embodiments, the array base plate 100 further includes at least one peripheral connection line 30 connected with two or more of the semiconductor portions 11, and the connection end 21 of the electrostatic protection portion 20 is connected with the peripheral connection line 30.

In these embodiments, the peripheral connection line 30 can be connected with two or more semiconductor portions 11, and the electrostatic protection portion 20 can be connected with two or more semiconductor portions 11 through the peripheral connection line 30, so that one electrostatic protection portion 20 can provide electrostatic protection for two or more semiconductor portions 11, and the wiring structure of the array base plate 100 is simplified.

Figure 6:
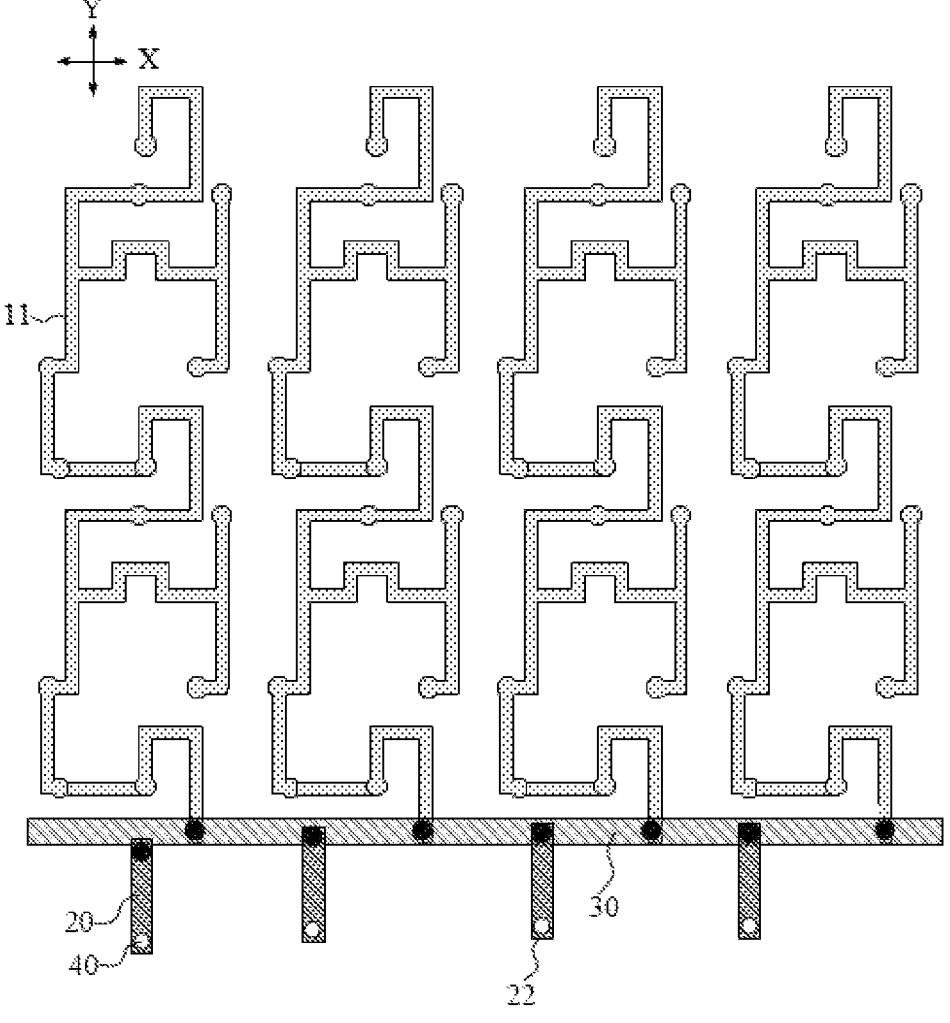
FIG. 6 shows a schematic layout of the semiconductor portion of the array base plate according to another embodiment of the first aspect of the present application.

Referring to FIG. 6, which shows a schematic layout of the semiconductor portion 11 of the array base plate 100 according to another embodiment of the first aspect of the present application.

As shown in FIG. 6, in some embodiments, a plurality of the semiconductor portions 11 arranged along the second direction are connected with each other, the peripheral connection line 30 is connected with any of the plurality of semiconductor portions 11 arranged along the second direction, and the peripheral connection line 30 is connected with two or more of the semiconductor portions 11 arranged along the first direction.

In these embodiments, the first direction X is the row direction, and the second direction Y is the column direction, the semiconductor portions 11 in a same column are connected with each other, and the peripheral connection line 30 may be connected with the plurality of semiconductor portions 11 in a same column by connecting any of the semiconductor portions 11 in the column. If the peripheral connection line 30 is connected with two or more of the semiconductor portions 11 arranged along the first direction, the peripheral connection line 30 can be connected with two or more columns of semiconductor portions 11 through the two or more semiconductor portions 11 arranged along the first direction, so that the electrostatic protection portion 20 can be connect with two or more columns of semiconductor portions 11 through the peripheral connection line 30 and provide electrostatic protection for the two or more columns of semiconductor portions 11 through the peripheral connection line 30, therefore the wiring structure of the array base plate 100 is further simplified.

In some other embodiments, a plurality of the semiconductor portions 11 arranged along the first direction X are connected with each other, the peripheral connection line 30 is connected with any of the plurality of semiconductor portions 11 arranged along the first direction X, and the peripheral connection line 30 is connected with two or more of the semiconductor portions 11 arranged along the second direction Y.

In these embodiments, since the semiconductor portions 11 in a same row are connected with each other, the peripheral connection line 30 may be connected with the plurality of semiconductor portions 11 in a same row by connecting any of the semiconductor portions 11 in the row. If the peripheral connection line 30 is connected with two or more of the semiconductor portions 11 arranged along the second direction Y, the peripheral connection line 30 can be connected with two or more rows of semiconductor portions 11 through the two or more semiconductor portions 11 arranged along the second direction Y, so that the electrostatic protection portion 20 can be connected with two or more rows of semiconductor portions 11 through the peripheral connection line 30 and provide electrostatic protection for the two or more rows of semiconductor portions 11 through the peripheral connection line 30, therefore the wiring structure of the array base plate 100 is further simplified.

Figure 7:
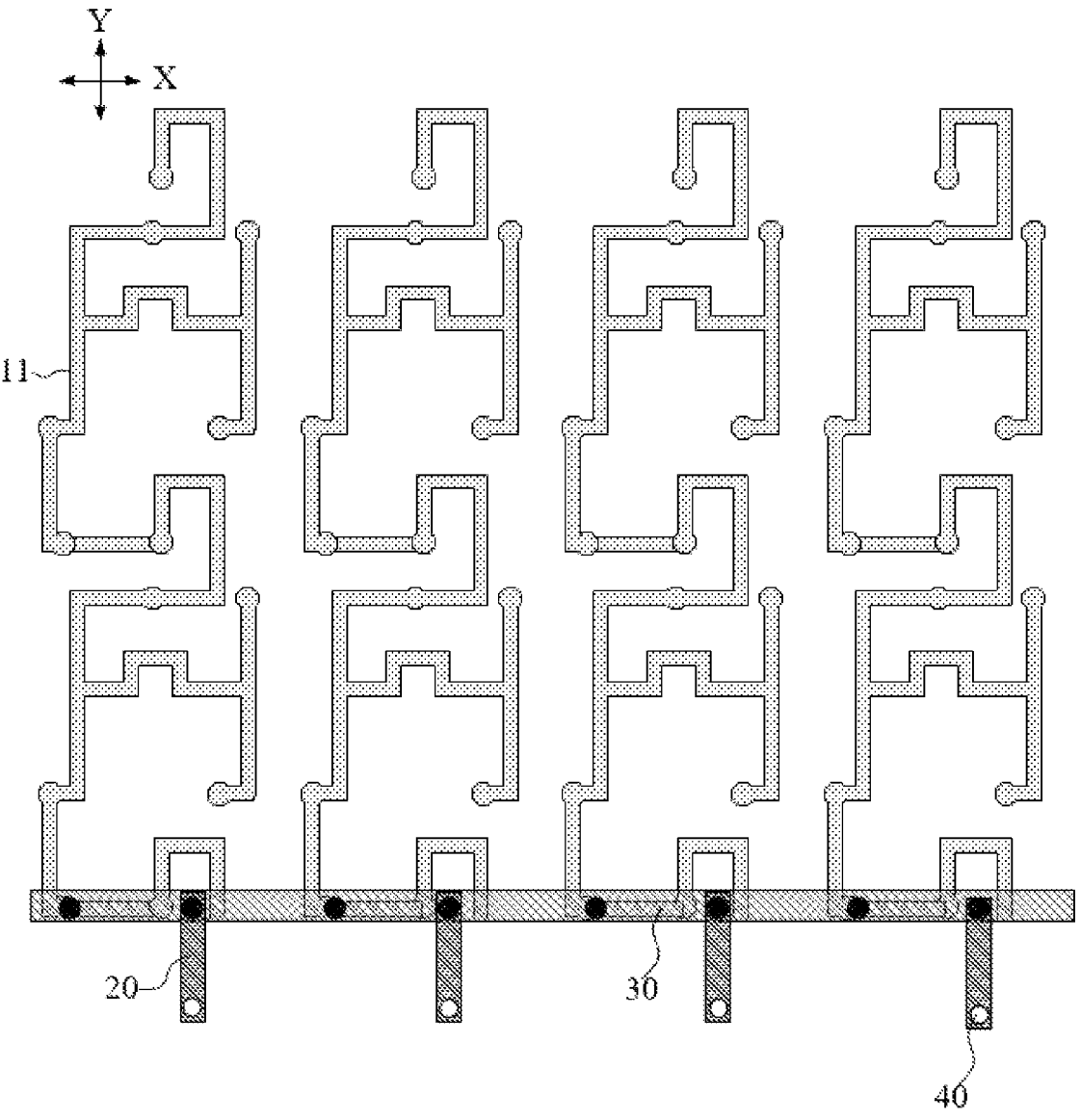
FIG. 7 shows a schematic layout of the semiconductor portion of the array base plate according to yet another embodiment of the first aspect of the present application.
Figure 8:
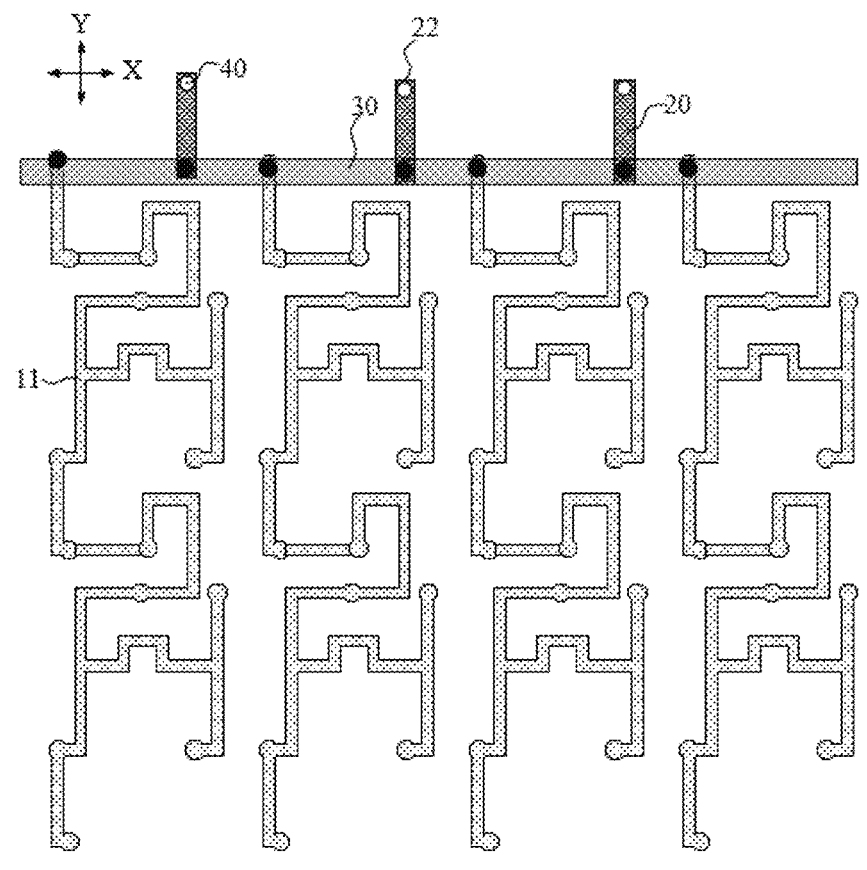
FIG. 8 shows a schematic layout of the semiconductor portion of the array base plate according to yet another embodiment of the first aspect of the present application.

Referring to FIG. 7 and FIG. 8 together, FIG. 7 illustratively shows another way of connection between the peripheral connection line 30 and the semiconductor portions 11, and FIG. 8 shows another way of connection between the peripheral connection line 30 and the semiconductor portions 11.

The peripheral connection line 30 may be arranged in various ways. In order to simplify the wiring structure of the array base plate 100, at least one peripheral connection line 30 is located at at least one side of the plurality of pixel circuits 10 along the second direction Y, that is, the peripheral connection line 30 is located at at least one side of the plurality of pixel circuits 10 along the column direction. As shown in FIG. 6 and FIG. 7, the semiconductor portions 11 of the plurality of pixel circuits 10 arranged along the second direction Y are connected with each other, and the peripheral connection line 30 is located at the lower side of the plurality of pixel circuits 10 along the second direction Y. As shown in FIG. 8, the semiconductor portions 11 of the plurality of pixel circuits 10 arranged along the second direction Y are connected with each other, and the peripheral connection line 30 is located at the upper side of the plurality of pixel circuits 10 along the second direction Y. The peripheral connection line 30 can be connected with a plurality semiconductor portions 11 at one side and further connected with a plurality of columns of semiconductor portions 11, so that the wiring path of the peripheral connection line 30 can be simplified, and the length of the peripheral connection line 30 is reduced.

Only one peripheral connection line 30 is shown in FIG. 6 to FIG. 8, and in other embodiments, the array base plate may include two or more peripheral connection lines 30, which can effectively improve the electrostatic protection performance of the array base plate.

At at least one side of the plurality of pixel circuits 10 along the second direction Y, the peripheral connection line 30 is connected with a plurality of semiconductor portions 11 distributed along the first direction X and further connected with a plurality of columns of semiconductor portions 11. In some embodiments, the peripheral connection line 30 is located at one side of the pixel circuits 10 along the second direction Y and connected with all the semiconductor portions 11 arranged along the second direction Y which are adjacent to the peripheral connection line 30, so that the peripheral connection line 30 can be connected with all the semiconductor portions 11, and the electrostatic protection portion 20 can provide electrostatic protection for all the semiconductor portions 11 through the peripheral connection line 30.

In some embodiments, if the edge of the display area AA is irregular and the pixel circuits 10 are distributed adjacent to the edge of the display area AA along the irregular path, the peripheral connection line 30 may extend along the irregular path, provided that the peripheral connection line 30 is located at at least one side of the plurality of pixel circuits 10 along the second direction.

The number of the electrostatic protection portions 20 may be set in various ways, for example, only one electrostatic protection portion 20 is connected with the peripheral connection line 30. In some embodiments, one electrostatic protection portion 20 is connected at the middle of the peripheral connection line 30, so as to ensure the balance of the electrostatic protection.

In some other embodiments, there are a plurality of electrostatic protection portions 20 distributed at intervals along the extending direction of the peripheral connection line 30. The electrostatic protection performance can be improved by the plurality of electrostatic protection portions 20.

In some embodiments, the plurality of electrostatic protection portions 20 are uniformly distributed along the extending direction of the peripheral connection line 30, so as to ensure the balance of the electrostatic protection.

In some embodiments, the first direction X is the row direction, and the second direction Y is the column direction, if the numbers of the pixel circuits 10 in adjacent two rows are different, that is, the numbers of the semiconductor portions 11 in adjacent two rows are different, the peripheral connection line 30 extends along a bending path and is arranged around the plurality of pixel circuits 10. The peripheral connection line 30 includes a first segment extending along the first direction X and a second segment extending along the second direction Y, and the electrostatic protection portion 20 may be connected with the first segment and/or the second segment. For example, the electrostatic protection portion 20 is connected with the second segment and extends along the first direction X. In some embodiments, a plurality of electrostatic protection portions 20 are connected with the same second segment and arranged at intervals along the second direction Y. Alternatively, a plurality of electrostatic protection portions 20 are connected with the first section and extend along the second direction. In some embodiments, a plurality of electrostatic protection portions 20 are connected with the same first segment and arranged at intervals along the first direction X.

In some embodiments, a distance between two adjacent ones of the electrostatic protection portions 20 is greater than or equal to a distance between two adjacent ones of the pixel circuits 10. For example, the distance between two adjacent ones of the electrostatic protection portions 20 is greater than or equal to the distance between two adjacent ones of the pixel circuits 10 along the first direction X, or the distance between two adjacent ones of the electrostatic protection portions 20 is greater than or equal to the distance between two adjacent ones of the pixel circuits 10 along the second direction Y. The distance between two adjacent ones of the electrostatic protection portions 20 is relatively great, so that the difficulty of manufacturing the array base plate 100 due to too dense electrostatic protection portions 20 can be reduced.

Figure 9:
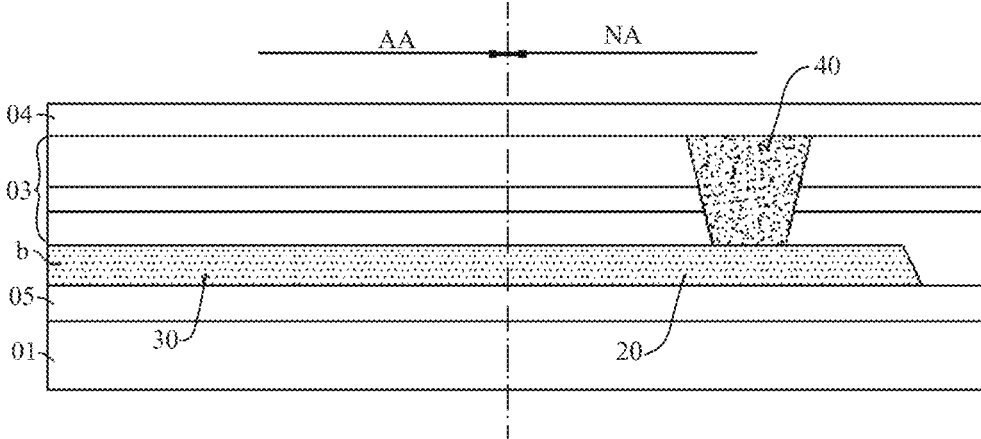
FIG. 9 shows a schematic cross-sectional view of the array base plate according to yet another embodiment of the first aspect of the present application.

Referring to FIG. 9, which shows a schematic cross-sectional view of the array base plate 100 according to yet other embodiment of the first aspect of the present application.

As shown in FIG. 9, in some embodiments, the semiconductor layer b includes the semiconductor portion 11, and the peripheral connection line 30 is located in the semiconductor layer b; the array base plate 100 further includes an insulating layer 03 located at a side of the semiconductor layer b away from the substrate 01.

The peripheral connection line 30 is located in the semiconductor layer b, that is, the peripheral connection line 30 may be arranged in the same layer as the semiconductor layer b, or the semiconductor layer b includes the peripheral connection line 30.

In these embodiments, the semiconductor layer b may include the peripheral connection line 30, so that the peripheral connection line 30 and the semiconductor portion 11 can be formed in the same layer and by the same material and process. On the one hand, the connection strength between the peripheral connection line 30 and the semiconductor unit 11 can be increased, and on the other hand, the process for manufacturing the array base plate 100 can be simplified, so as to improve the manufacturing efficiency of the array base plate 100.

In some embodiments, a buffer layer 05 is further arranged on the substrate 01.

The insulating layers 03 may be arranged in various ways. In some embodiments, the array base plate 100 further includes metal layers located at a side of the semiconductor layer b away from the substrate 01, the insulating layer 03 is arranged between the semiconductor layer b and the metal layers, and generally, the number of the metal layers is two or more, the insulating layer 03 is arranged between every adjacent two metal layers. Therefore, the number of the insulating layers 03 is two or more, that is, two or more insulating layers 03 are arranged at a side of the semiconductor layer b away from the substrate 01. The insulating layers 03 may include a gate insulating layer, a capacitor insulating layer, an interlayer dielectric layer, and the like, which may be specifically arranged according to actual situations, and is not limited herein.

The electrostatic protection portion 20 may be arranged in various ways. As shown in FIG. 9, in some embodiments, the electrostatic protection portion 20 is located in the semiconductor layer b. For example, the semiconductor layer b may include the electrostatic protection portion 20, and the electrostatic protection portion 20, the peripheral connection line 30 and the semiconductor portion 11 are located in the same layer structure. On the one hand, the connection strength between the peripheral connection line 30 and the semiconductor portion 11 and the connection strength between the electrostatic protection portion 20 and the peripheral connection line 30 can be increased, and on the other hand, the electrostatic protection portion 20, the peripheral connection line 30 and the semiconductor portion 11 can be manufactured in the same process, the process for manufacturing the array base plate 100 is further simplified, and the manufacturing efficiency of the array base plate 100 is improved.

The electrostatic protection portion 20 being located in the semiconductor layer b may mean that the semiconductor layer b may include the electrostatic protection portion 20, or the electrostatic protection portion 20 and the semiconductor layer b are arranged in the same layer.

If the electrostatic protection portion 20 is located in the semiconductor layer b, in some embodiments, as shown in FIG. 9, a metal discharging portion 40 is arranged in the insulating layer 03 and connected with the free end 22. In these embodiments, the free end 22 is connected with the metal discharging portion 40, so that the free end 22 may discharge the static electricity through the metal discharging portion 40, and the static electricity discharging and the semiconductor portion 11 are not in the same layer, the electrostatic protection effect can be improved.

In some embodiments, an orthographic projection of the metal discharging portion 40 on the substrate 01 overlaps an orthographic projection of the free end 22 on the substrate 01, so that the distance between the metal discharging portion 40 and the free end 22 can be reduced, and the structure of the array base plate 100 is simplified.

The metal discharging portion 40 may be arranged in various ways. In some embodiments, a through via is arranged in the insulating layer 03, the free end 22 is exposed by the through via, and a metal material is arranged in the through via to form the metal discharging portion 40.

In some embodiments, the array base plate 100 further includes a planarization layer 04 located at a side of the insulating layer 03 away from the semiconductor layer b and covering the metal discharging portion 40. In these embodiments, the surface nonflatness of the array base plate 100 due to the arrangement of the metal discharging portion 40 can be reduced by the planarization layer 04.

Figure 10:
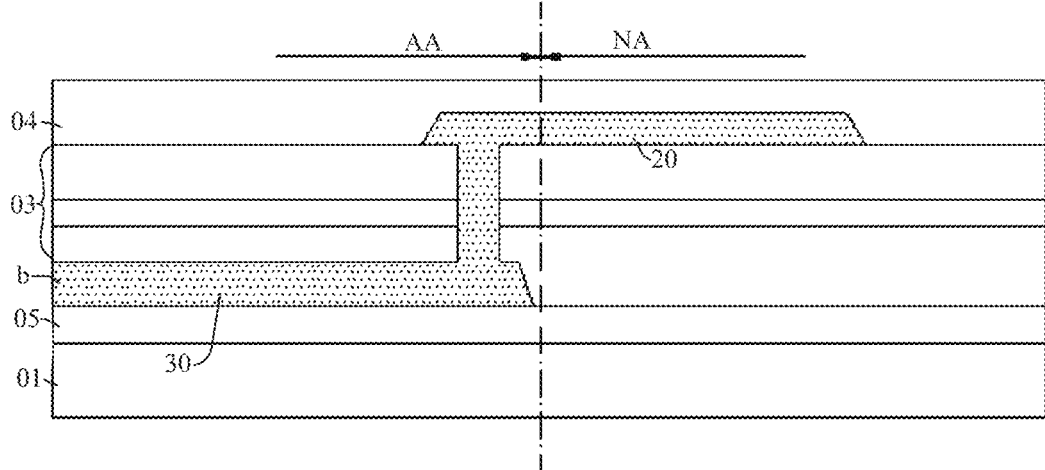
FIG. 10 shows a schematic cross-sectional view of the array base plate according to another embodiment of the first aspect of the present application.

Referring to FIG. 10, which shows a schematic cross-sectional view of the array base plate 100 according to another embodiment of the first aspect of the present application.

As shown in FIG. 10, in some other embodiments, the electrostatic protection portion 20 is arranged at a side of the insulating layer 03 away from the semiconductor layer b, and the array base plate 100 further includes the planarization layer 04 located at a side of the electrostatic protection portion 20 away from the semiconductor layer b, and the electrostatic protection portion 20 is located in the planarization layer 04, that is, the planarization layer 04 covers the electrostatic protection portion 20; and a connection via is arranged in the insulating layer 03, and the electrostatic protection portions 20 are connected with the peripheral connection line 30 through the connection via.

In these embodiments, the electrostatic protection portion 20 is arranged in a different layer from the peripheral connection line 30 and the semiconductor portion 11, so that the static electricity on the semiconductor portion 11 can be discharged in other layers, the effect of static electricity discharging on the semiconductor portion 11 is reduced, and the electrostatic protection performance of the array base plate 100 is improved.

It should be noted that the above embodiments can be combined with each other without contradiction.

Figure 11:
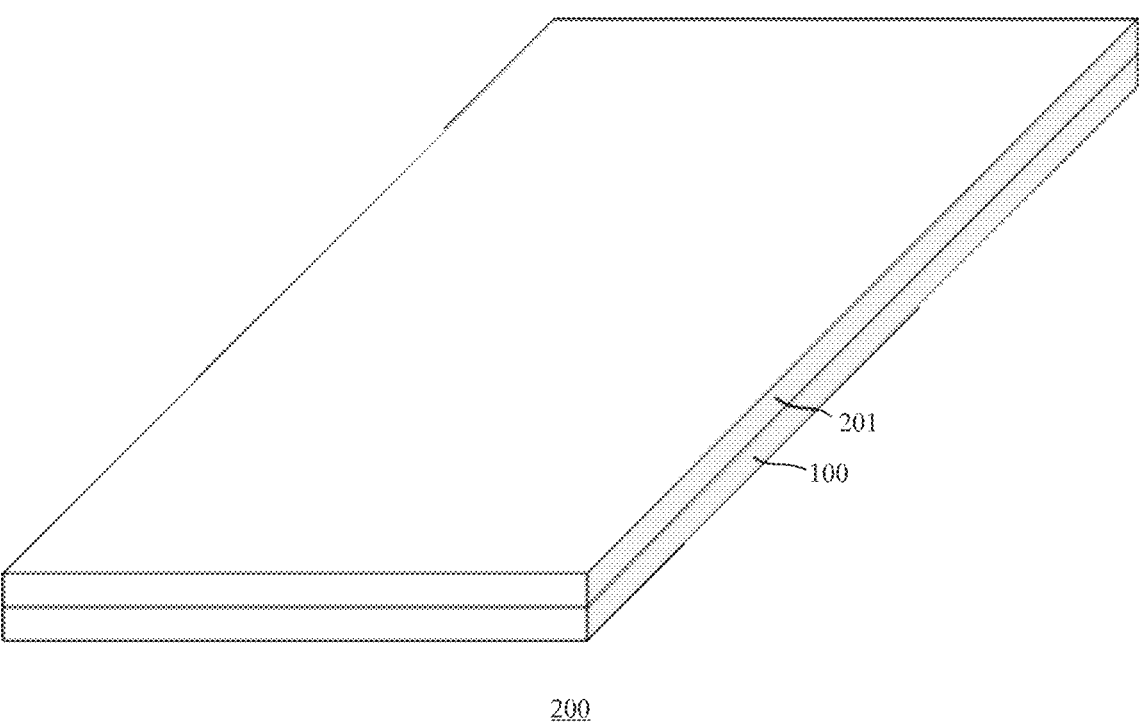
FIG. 11 shows a schematic structural diagram of a display panel according to the embodiments of the present application.

The embodiments of the present application further provide a display panel including the array base plate according to any of the above embodiments. FIG. 11 shows a schematic structural diagram of a display panel according to the embodiments of the present application. As shown in FIG. 11, the display panel 200 includes the array base plate 100 according to any of the above embodiments and a light-emitting layer 201 located on the array base plate 100. The light-emitting layer 201 may be used as a display device layer, and exemplarily, the light-emitting layer 201 may be an organic light-emitting layer, that is, the display panel 200 may be an organic light emitting diode (OLED) display panel. The display panel may be other types of display panel, which is not limited in the present application.

Figure 12:
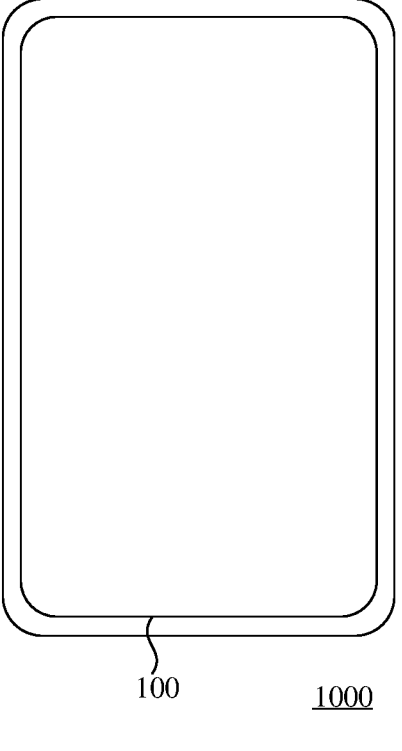
FIG. 12 shows a schematic structural diagram of a display apparatus according to the embodiments of the present application.

The present application further provides a display apparatus including the array base plate according to the present application. Referring to FIG. 12, which shows a schematic structural diagram of a display apparatus according to the embodiments of the present application. The display apparatus 1000 as shown in FIG. 12 includes the array base plate 100 according to any of the above embodiments of the present application. In the embodiment of FIG. 12, exemplarily, the display apparatus 1000 is illustrated as a mobile phone. The display apparatus according to the embodiments of the present application may be other display apparatus with display function, such as, a wearable product, a computer, a television, and a vehicle-mounted display apparatus, which is not limited in present application. The display apparatus according to the embodiments of the present application has the beneficial effects of the array base plate according to the embodiments of the present application, reference is made to the specific description of the array base plate in the above embodiments for details, which are not repeated herein.

The above embodiments of the present application do not exhaustively describe all the details, nor do they limit the present application to the specific embodiments as described. Obviously, according to the above description, many modifications and changes can be made. These embodiments are selected and specifically described in the specification to better explain the principles and practical applications of the present application, so that those skilled in the art can make good use of the present application and make modifications based on the present application. The present application is limited only by the claims and the full scope and equivalents thereof

What is claimed is:

1. An array base plate comprising:
   a display area and a non-display area arranged adjacently;
   a substrate;
   a semiconductor layer located on the substrate and comprising a plurality of semiconductor portions distributed in an array along a first direction and a second direction;
   one or more electrostatic protection portions, wherein each electrostatic protection portion of the one or more electrostatic protection portions comprises a connection end and a free end opposing to each other, the connection end being connected with at least one semiconductor portion of the plurality of semiconductor portions, and the free end extending from the connection end to the non-display area; and
   at least one peripheral connection line located in the semiconductor layer and connected with two or more semiconductor portions of plurality of the semiconductor portions, wherein the connection end of the one or more electrostatic protection portions is connected with the at least one peripheral connection line; and
   an insulating layer located at a side of the semiconductor layer away from the substrate, wherein
   the one or more electrostatic protection portions are located in the semiconductor layer, or
   the one or more electrostatic protection portions are located at a side of the insulating layer away from the semiconductor layer.

2. The array base plate according to claim 1, wherein
   a plurality of the semiconductor portions arranged along the second direction is connected with each other,
   the at least one peripheral connection line is connected with any of the plurality of semiconductor portions arranged along the second direction, and
   the at least one peripheral connection line is connected with two or more semiconductor portions of the plurality of semiconductor portions arranged along the first direction.

3. The array base plate according to claim 2, further comprising:
   a plurality of pixel circuits located in the display area, each pixel circuit of the plurality of pixel circuits comprising at least one semiconductor portion, wherein the at least one peripheral connection line is located at at least one side of the plurality of pixel circuits along the second direction and connected with the plurality of the semiconductor portions distributed along the first direction.

4. The array base plate according to claim 3, wherein a number of the one or more electrostatic protection portions is two or more, and the two or more electrostatic protection portions are arranged at intervals along an extending direction of the at least one peripheral connection line.

5. The array base plate according to claim 4, wherein the one or more electrostatic protection portions are uniformly distributed along the extending direction of the at least one peripheral connection line.

6. The array base plate according to claim 4, wherein a distance between two adjacent electrostatic protection portions of the one or more electrostatic protection portions is greater than or equal to a distance between two adjacent pixel circuits of the plurality of pixel circuits.

7. The array base plate according to claim 3, wherein:
an edge of the display area is irregular,
the plurality of pixel circuits is distributed adjacent to the edge of the display area along an irregular path, and
the at least one peripheral connection line extends along the irregular path.

8. The array base plate according to claim 3, wherein:
the first direction is a row direction,
the second direction is a column direction,
the at least one peripheral connection line extends along a bending path and is arranged around the plurality of pixel circuits,
the at least one peripheral connection line comprises a first segment extending along the first direction and a second segment extending along the second direction, and
the one or more electrostatic protection portions are connected with at least one of the first segment and the second segment.

9. The array base plate according to claim 8, wherein a number of the one or more electrostatic protection portions is two or more, and
the two or more electrostatic protection portions are connected with the second segment and arranged at intervals along the second direction, or
the two or more electrostatic protection portions are connected with the first segment and arranged at intervals along the first direction.

10. The array base plate according to claim 1, wherein the one or more electrostatic protection portions are located in the semiconductor layer, and a metal discharging portion is arranged in the insulating layer and connected with the free end.

11. The array base plate according to claim 10, further comprising:
a planarization layer located at a side of the insulating layer away from the semiconductor layer and covering the metal discharging portion.

12. The array base plate according to claim 10, wherein an orthographic projection of the metal discharging portion on the substrate overlaps an orthographic projection of the free end on the substrate.

13. The array base plate according to claim 12, wherein a through via is arranged in the insulating layer, the free end is exposed by the through via, and a metal material is arranged in the through via to form the metal discharging portion.

14. The array base plate according to claim 1, wherein the one or more electrostatic protection portions are located at a side of the insulating layer away from the semiconductor layer, and the array base plate further comprises:
a planarization layer located at a side of the one or more electrostatic protection portions away from the semiconductor layer and covering the one or more electrostatic protection portions; and
a connection via is arranged in the insulating layer, and the one or more electrostatic protection portions are connected with the peripheral connection line through the connection via.

15. The array base plate according to claim 1, wherein;
the plurality of the semiconductor portions arranged along the first direction is connected with each other,
the at least one peripheral connection line is connected with any semiconductor portion of the plurality of semiconductor portions arranged along the first direction, and
the at least one peripheral connection line is connected with two or more semiconductor portions of the plurality of semiconductor portions arranged along the second direction.

16. The array base plate according to claim 1, wherein the one or more electrostatic protection portions and the plurality of semiconductor portions are arranged in one-to-one correspondence, and each semiconductor portion of the plurality of semiconductor portions is connected with a corresponding electrostatic protection portion of the one or more electrostatic protection portions.

17. A display panel, comprising the array base plate according to claim 1.

18. An array base plate comprising:
a display area and a non-display area arranged adjacently;
a substrate;
a semiconductor layer located on the substrate and comprising a plurality of semiconductor portions distributed in an array along a first direction and a second direction;
one or more electrostatic protection portions, wherein each electrostatic protection portion of the one or more electrostatic protection portions comprises a connection end and a free end opposing to each other, the connection end being connected with at least one semiconductor portion of the plurality of semiconductor portions, and the free end extending from the connection end to the non-display area; and
at least one peripheral connection line connected with two or more semiconductor portions of the plurality of semiconductor portions, wherein:
the connection end of the one or more electrostatic protection portions is connected with the at least one peripheral connection line,
a plurality of the semiconductor portions arranged along the first direction is connected with each other,
the at least one peripheral connection line is connected with any semiconductor portion of the plurality of semiconductor portions arranged along the first direction, and
the at least one peripheral connection line is connected with two or more semiconductor portions of the plurality of semiconductor portions arranged along the second direction.

* * * * *